(12) United States Patent
Jensen

(10) Patent No.: US 8,350,642 B2
(45) Date of Patent: Jan. 8, 2013

(54) POWER SPLITTER/COMBINER

(75) Inventor: Hans Jensen, Fayetteville, NY (US)

(73) Assignee: Anaren, Inc., East Syracuse, NY (US)

( * ) Notice: Subject to any disclaimer, the term of this patent is extended or adjusted under 35 U.S.C. 154(b) by 564 days.

(21) Appl. No.: 12/501,171

(22) Filed: Jul. 10, 2009

(65) Prior Publication Data

US 2010/0007433 A1 Jan. 14, 2010

Related U.S. Application Data

(60) Provisional application No. 61/079,448, filed on Jul. 10, 2008.

(51) Int. Cl.
*H03H 7/46* (2006.01)

(52) U.S. Cl. ............... 333/132; 333/126; 333/129

(58) Field of Classification Search .......... 333/126–129, 333/132, 134
See application file for complete search history.

(56) References Cited

U.S. PATENT DOCUMENTS

| | | | |
|---|---|---|---|
| 6,125,107 | A | 9/2000 | Johnson et al. |
| 6,552,691 | B2 | 4/2003 | Mohuchy et al. |
| 7,400,193 | B2 | 7/2008 | Wyatt |
| 7,557,673 | B1 * | 7/2009 | Meharry ............ 333/25 |
| 2002/0116720 | A1 | 8/2002 | Terry et al. |
| 2004/0217823 | A1 * | 11/2004 | Tayrani et al. ........ 333/26 |
| 2007/0161357 | A1 | 7/2007 | Tudosoiu et al. |
| 2009/0121948 | A1 | 5/2009 | Nysen |
| 2009/0122847 | A1 | 5/2009 | Nysen |

FOREIGN PATENT DOCUMENTS

| | | |
|---|---|---|
| EP | 2096767 A2 * | 9/2009 |
| WO | 2008082148 A1 | 7/2008 |

OTHER PUBLICATIONS

Seymour B. Cohn; A Class of Broadband Three-Port TEM-Mode Hybrids; IEEE Transactions on Microwave Theory and Techniques; vol. MTT-16, No. 2, Feb. 1968; pp. 110-116.

Udo Barabas; On an Ultrabroad-Band Hybrid Tee; IEEE Transactions on Microwave Theory and Techniques; vol. MTT-27, No. 1, Jan. 1979; pp. 58-64.

Marcatili et al.; Broad-Band Directional Couplers; IRE Transactions on Microwave Theory and Techniques; Jul. 1962; pp. 251-257.

Ernest J. Wilkinson; An N-Way Hybrid Power Divider; IRE Transactions on Microwave Theory and Techniques; Jan. 1960; pp. 116-118.

* cited by examiner

*Primary Examiner* — Robert Pascal
*Assistant Examiner* — Kimberly Glenn
(74) *Attorney, Agent, or Firm* — Daniel P. Malley; Bond Schoeneck & King

(57) ABSTRACT

The present invention is directed to a system that includes a front-end interface device having a first front-end interface port, a second front-end interface port and a third front-end interface port. The front-end interface device is configured to split a first signal directed into the first front-end interface port into a second signal provided at the second front-end interface port and a third signal provided at the third front-end interface port. An N-way high-band device includes a first high-band device port coupled to the second front-end interface port and N second high band ports. An N-way low-band device includes a first low-band device port coupled to the third front-end interface port and N-second low band ports. N back-end interface devices are coupled to the N-way high-band device and the N-way low-band device.

34 Claims, 5 Drawing Sheets

POWER SPLITTER/COMBINER

CROSS-REFERENCE TO RELATED APPLICATIONS

This application claims priority to U.S. Provisional Patent Application Ser. No. 61/079,448 filed on Jul. 10, 2008, the content of which is relied upon and incorporated herein by reference in its entirety, and the benefit of priority under 35 U.S.C. §119(e) is hereby claimed.

BACKGROUND OF THE INVENTION

1. Field of the Invention

The present invention relates generally to RF components, and particularly to RF splitters/combiners.

2. Technical Background

It is often desirable to divide an incident RF signal into two or more versions of the incident RF signal. The input RF signal is often split into two (2) output signals by a single 1×2 splitter. The RF signal may be split into more than two output signals (e.g., 4, 8, 16, 32, etc.) by cascading stages to form a splitter network. One important objective of the splitter is to divide the RF signal equally into the various output signals with minimum insertion loss. Insertion loss refers to the dissipation of signal power within the splitter itself. Insertion losses may be the result of signal power being converted into thermal energy (i.e., $I^2R$ losses) or from other causes. There are various types of splitters that may be employed to form a splitter network. Unfortunately, each of the various types has drawbacks associated with them.

In one approach that has been considered, Wilkinson type hybrid power dividers are employed to create a multi-stage network. This approach has several drawbacks including narrow bandwidth characteristics. While the inventor of the present invention has found that a network of this type often has superior performance at relatively high frequencies, it will perform poorly at lower frequencies. Furthermore, this approach is also impractical at lower frequencies because of size considerations.

Resistive power splitter networks have also been considered. These types of networks, theoretically at least, have infinite bandwidth, but the insertion loss is too high (3 dB above 3 dB splitting loss) to be of practical use. Another drawback relates to the fact that the isolation is limited to 6 dB.

In yet another approach, the use of wide-band balun technology based on the Guanella style balun has been considered. However, Guanella style baluns do not have adequate bandwidth. Another drawback to this approach relates to the lack of isolation between the output ports. This feature could cause significant ripple in the response due to various mismatches in the network.

In yet another approach, a lumped element splitter network has been considered. This approach works well at relatively low frequencies; however, the insertion loss and return loss performance degrades rapidly above a relatively low frequency.

What is needed is a splitter/combiner system that is configured to split an incident RF signal into many output signals over an ultra-wide signal bandwidth without substantial insertion losses.

SUMMARY OF THE INVENTION

The present invention addresses the needs described above by providing a splitter/combiner system that is configured to split an incident RF signal into many output signals over an ultra-wide signal bandwidth without substantial insertion losses.

One aspect of the present invention is directed to a system that includes a front-end interface device having a first front-end interface port, a second front-end interface port and a third front-end interface port. The front-end interface device is configured to split a first signal directed into the first front-end interface port into a second signal provided at the second front-end interface port and a third signal provided at the third front-end interface port. The first signal has a first bandwidth, the second signal has a second bandwidth and the third signal has a third bandwidth. The second bandwidth is substantially disposed in a relatively high frequency portion of the first bandwidth and the third bandwidth is substantially disposed in a relatively low frequency portion of the first bandwidth. An N-way high-band device includes a first high-band device port coupled to the second front-end interface port and N second high band ports. N is an integer greater than or equal to two (2). The N-way high-band device is configured to split the second signal into N-high band signals and direct the N-high band signals out of corresponding ones of the N-second high band ports. An N-way low-band device includes a first low-band device port coupled to the third front-end interface port and N-second low band ports. The N-way low-band device is configured to split the third signal into N-low band signals and direct the N-low band signals out of corresponding ones of the N-second low band ports. N back-end interface devices are coupled to the N-way high-band device and the N-way low-band device. Each back-end interface device of the N back-end interface devices includes a first back-end interface port coupled to a corresponding one of the N second high band ports, a second back-end interface port coupled to a corresponding one of the N second low band ports, and a third back-end interface port. Each back-end interface is configured to combine one of the N-high band signals and one of the N-low band signals to form a fourth signal directed out of the third back-end interface port such that N-fourth signals are directed out of the N back-end interface devices. The fourth signal has a fourth bandwidth. The fourth signal is a version of the first signal such that the fourth bandwidth and the first bandwidth are substantially identical.

In another aspect, the present invention is directed to a system that includes a front-end interface device having a first front-end interface port, a second front-end interface port and a third front-end interface port. The front-end interface device is configured to combine a second signal directed into the second front-end interface port and a third signal directed into the third front-end interface port to form a first signal directed out of the first front-end interface port. The first signal has a first bandwidth, the second signal has a second bandwidth and the third signal has a third bandwidth. The second bandwidth is substantially disposed in a relatively high frequency portion of the first bandwidth and the third bandwidth is substantially disposed in a relatively low frequency portion of the first bandwidth. An N-way high-band device includes a first high-band device port coupled to the second front-end interface port and N second high band ports. N is an integer greater than or equal to two (2). The N-way high-band device is configured to combine N-high band signals directed into corresponding ones of the N-second high band ports to form the second signal. An N-way low-band device includes a first low-band device port coupled to the third front-end interface port and N-second low band ports. The N-way low-band device is configured to combine N-low band signals directed into corresponding ones of the N-second low band ports to form the third signal. N back-end interface devices are coupled to the N-way high-band device and the N-way low-band device. Each back-end interface device of the N back-end interface devices includes a first back-end interface port coupled to a corresponding one of the N second high band ports, a second back-end interface port coupled to a corresponding one of the N second low band ports, and a third back-end interface port. Each back-end interface device is configured to split a fourth signal directed into the third back-end interface port into one of the N-high band signals and one of the N-low band signals. Each fourth signal has a fourth bandwidth, the fourth signal being a version of the first signal such that the fourth bandwidth and the first bandwidth are substantially identical.

In yet another aspect, the present invention is directed to a system that includes an input/output (I/O) diplexer including a first I/O diplexer port, a second I/O diplexer port and a third I/O diplexer port. The I/O diplexer is configured to split a first signal directed into the first I/O diplexer port into a second signal provided at the second I/O diplexer port and a third signal provided at the third I/O diplexer port. The I/O diplexer is configured to combine the second signal directed into the second I/O diplexer port and the third signal directed into the third I/O diplexer port to form the first signal provided at the first I/O diplexer port. The first signal has a first bandwidth, the second signal has a second bandwidth and the third signal has a third bandwidth. The second bandwidth is substantially disposed in a relatively high frequency portion of the first bandwidth and the third bandwidth is substantially disposed in a relatively low frequency portion of the first bandwidth. An N-way high-band splitter/combiner is coupled to the second I/O diplexer port and includes N-high band splitter/combiner ports. The N-way high-band splitter/combiner is configured to split the second signal into N-high band signals and direct the N-high band signals out of corresponding ports of the N-high band splitter/combiner ports. The N-way high-band splitter/combiner also is configured to combine the N-high band signals directed into the N-high-band splitter/combiner ports into the second signal. N is an integer greater than or equal to two (2). An N-way low-band splitter/combiner is coupled to the third I/O diplexer port and includes N-low band splitter/combiner ports. The N-way low-band splitter/combiner is configured to split the third signal into N-low band signals and direct the N-low band signals out of the N-low band splitter/combiner ports, The N-way low-band splitter/combiner also is configured to combine the N-low band signals directed into the N-low band splitter/combiner ports into the third signal. N-output/input (O/I) diplexers are coupled to the N-way high-band splitter/combiner and the N-way low-band splitter/combiner. Each O/I diplexer of the N-O/I diplexers includes a first O/I diplexer port coupled to a corresponding high band port of the N-high band splitter/combiner ports, a second O/I diplexer port coupled to a corresponding low band port of the N-low band splitter/combiner ports, and a third O/I port. Each O/I diplexer is configured to combine one of the N-high band signals and one of the N-low band signals to form a fourth signal directed out of the third O/I diplexer port such that N-fourth signals are directed out of the N-O/I diplexers. Each O/I diplexer also is configured to split the fourth signal into one of the N-high band signals and one of the N-low band signals such that the fourth signal is directed into the third O/I port. The high band signal is directed out of the first O/I port and the low band signal being directed out of the second O/I port. The fourth signal has a fourth bandwidth, the fourth signal being a version of the first signal such that the fourth bandwidth and the first bandwidth are substantially identical.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

DETAILED DESCRIPTION

Figure 1:
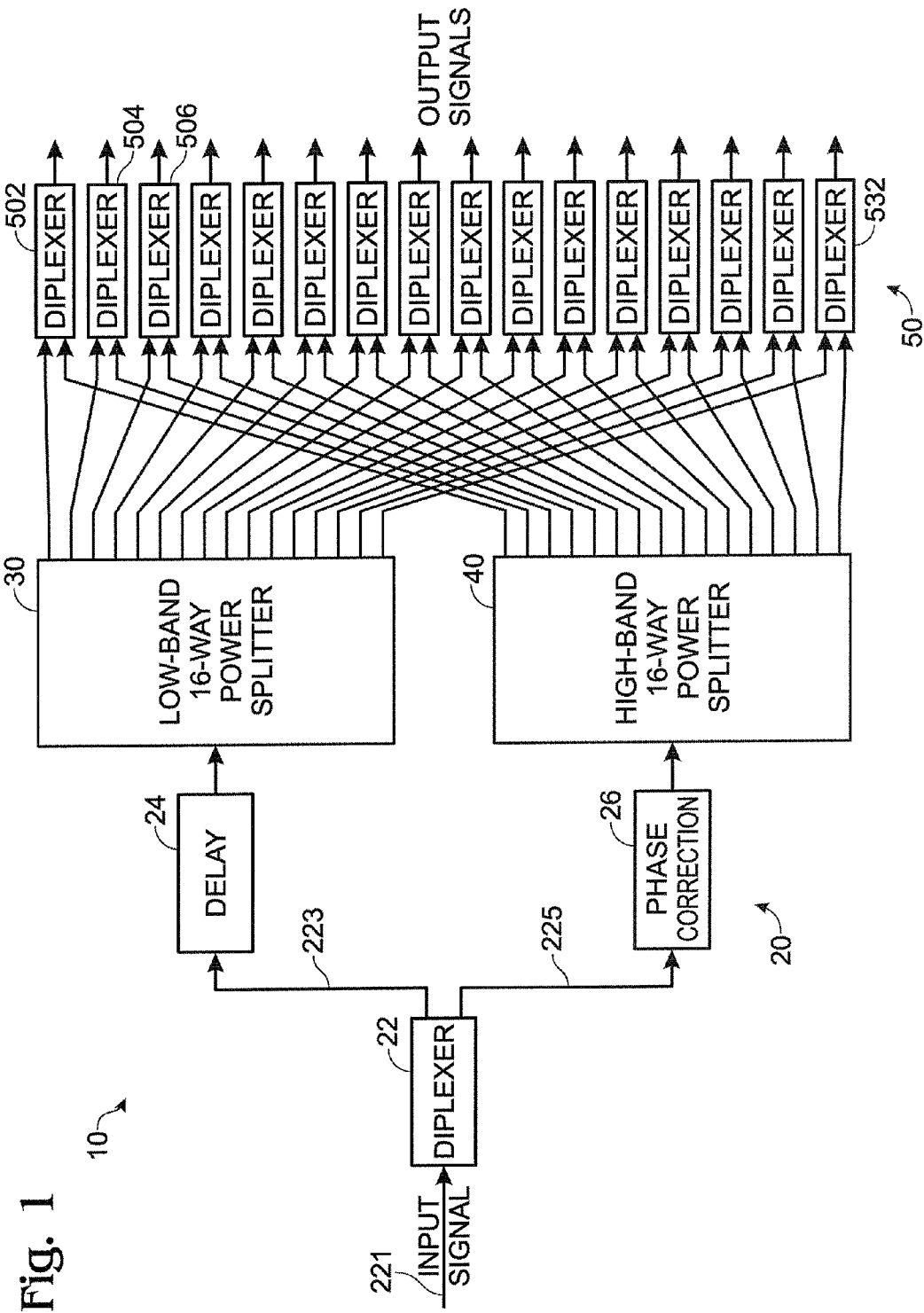
FIG. 1 is a schematic diagram of an ultra wide-band power splitter in accordance with an embodiment of the present invention.

Reference will now be made in detail to the present exemplary embodiments of the invention, examples of which are illustrated in the accompanying drawings. Wherever possible, the same reference numbers will be used throughout the drawings to refer to the same or like parts. An exemplary embodiment of the splitter system of the present invention is shown in FIG. 1, and is designated generally throughout by reference numeral 10.

As embodied herein, and depicted in FIG. 1, a schematic diagram of an ultra wide-band power splitter system 10 in accordance with an embodiment of the present invention is disclosed. The system 10 includes a front-end portion 20 coupled to a low band N-way power splitter 30 and a high band N-way splitter 40. In the example provided herein, N is equal to sixteen (16) for clarity of illustration; however, the invention should not be construed as being limited to sixteen. In one embodiment, N may be equal to the binary number $2^P$ (2, 4, 8, 16, 32, 64, . . . ), but is not limited to these values. N may be any suitable odd or even number, such as 3, 6, 7, 9, 10, 12, 14, etc. In any event, the low band N-way power splitter 30 and a high band N-way splitter 40 are disposed in parallel and further coupled to N back-end diplexers (502-532). The terms "front-end" and back-end," as used herein, are used to guide the reader from the left side of FIG. 1 (front end) to the right side of FIG. 1 (back-end). In one embodiment, ultra wideband power splitter system 10 may be employed as a splitter when an incident RF signal is directed into diplexer 22. Alternatively, system 10 may be employed as a combiner when N RF signals are directed, in parallel, into the N back end diplexers (502-532). In this embodiment, an RF output signal would be directed out of diplexer 22.

Therefore, the front end portion 20 of system 10 includes an input/output (I/O) diplexer 22 that has an I/O diplexer port 221, an I/O diplexer port 223 and an I/O diplexer port 225. The I/O diplexer 22 is configured to split an RF signal directed into the I/O diplexer port 221 into a low frequency band signal provided at the I/O diplexer port 223 and a high frequency band signal provided at the I/O diplexer port 225. As alluded to above, the I/O diplexer 20 is also configured to combine a low band signal directed into I/O diplexer port 223 and a high band signal directed into I/O diplexer port 225 to form an ultra wide band signal which is directed out of I/O diplexer port 221. Before moving on to a description of the power splitters (30, 40), a brief discussion of the meaning of the terms high band and low band is provided.

Figure 7:
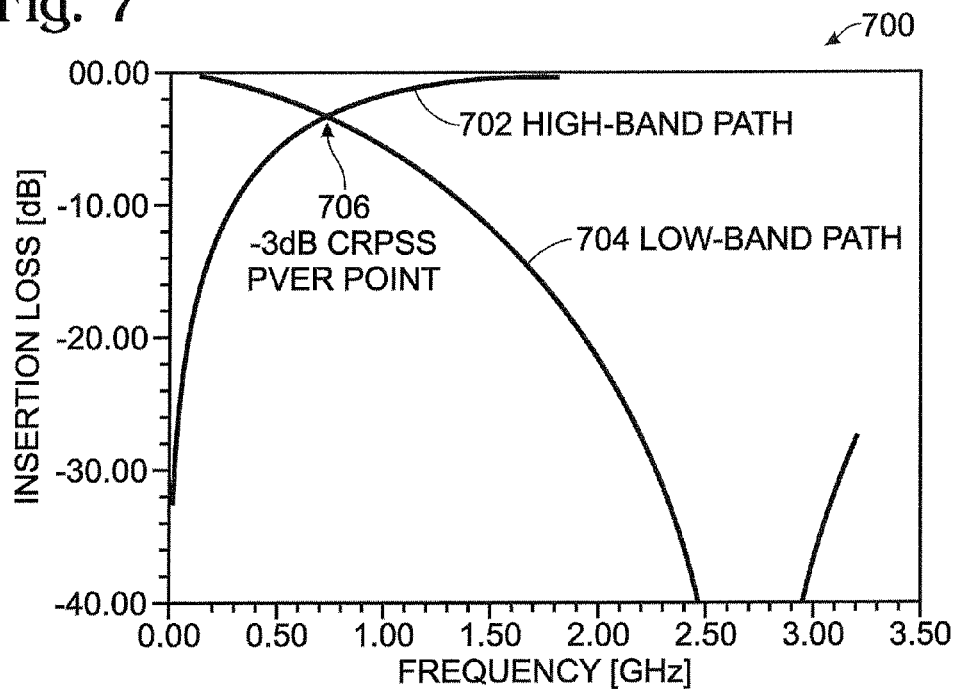
FIG. 7 is a chart illustrating the insertion loss performance of the diplexers depicted herein in accordance with an embodiment of the invention.
Figure 8:
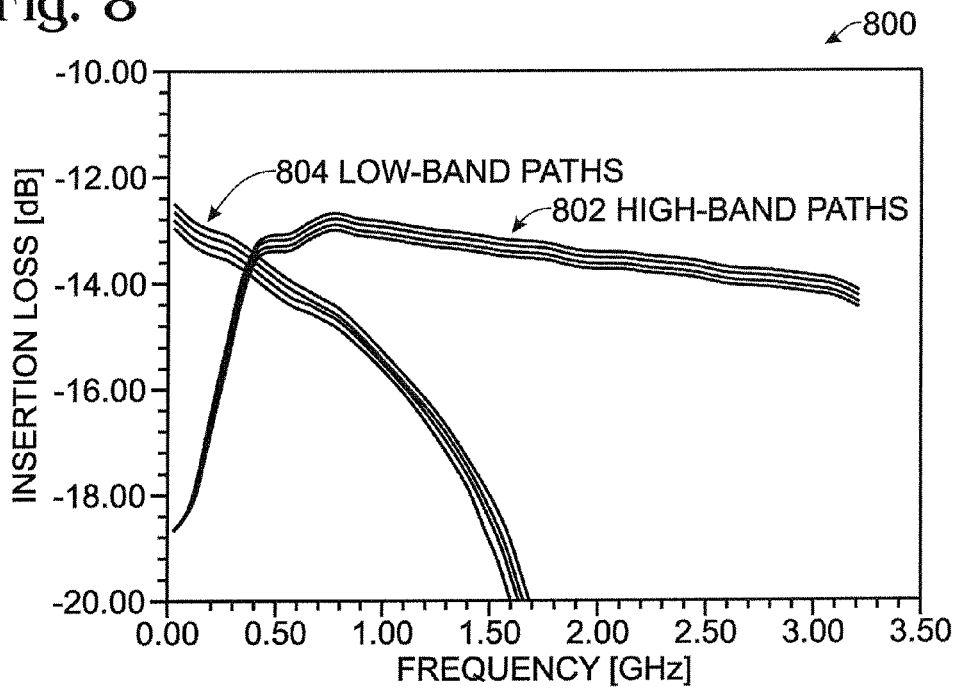
FIG. 8 is a chart illustrating the insertion loss performance of the high-frequency band splitters and the low-frequency band splitters depicted in FIG. 4A and FIG. 4B, respectively.
Figure 10:
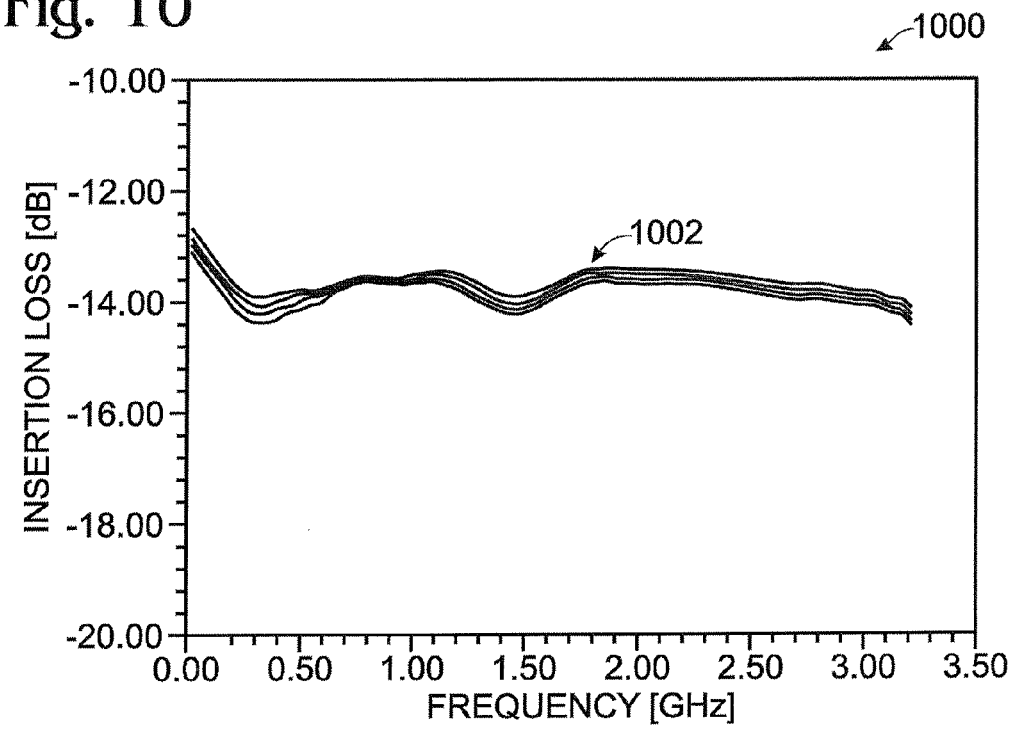
FIG. 10 is a chart illustrating the insertion loss performance for the ultra wide-band power splitter in accordance with an embodiment of the invention.

As shown graphically in FIGS. 7, 8 and 10, the wide band signal has a bandwidth that includes the frequency components of both the low band signal spectrum and the high band signal spectrum. The low band signal, of course, includes a relatively flat pass band (i.e., between 3 dB points) at relatively low frequency portions of the spectrum. The high band signal includes a relatively flat pass band (i.e., between 3 dB points) at relatively high frequency portions of the spectrum. The high end 3 dB point of the low frequency band may intersect the low end 3 dB point of the high frequency band a predetermined cross-over frequency. The design of the cross-over frequency will be described in greater detail below. Those of ordinary skill in the art will also understand that the cross-over frequency need not be exactly at the respective 3 dB points of the low band and high band. I/O diplexer 20 may be configured in accordance with various cross-over characteristics in mind. The term ultra-wide as used herein refers to a range of frequencies characterized by a ratio that includes several decades. For example, a ratio of about 300:1 may refer to a signal bandwidth, for example, substantially between 10 MHz to 3000 MHz. However, the present invention should not be construed as being limited to this example range. Those of ordinary skill in the art will understand that ratios of 200:1, 250:1, 350:1, 400:1, etc. are achievable. Those of ordinary skill in the art will also understand that the 3 dB points of the composite wide band signal spectrum may be shifted upward and downward along the frequency axis in accordance with the needs of the given application.

Referring back to FIG. 1, the front-end portion 20 may further include a delay element 24 disposed between the I/O diplexer port 223 and a port of the N-way low-band device 30. A phase correction element 26 is similarly disposed between the I/O diplexer port 225 and a port of the N-way high-band device 40. In certain circumstances, the position of the phase correction element 26 and the delay element 24 may be reversed such that the delay element 24 is disposed in the high band channel and the phase correction element 26 is disposed in the low band channel.

In any event, N-way high-band splitter/combiner 40 is coupled to I/O diplexer port 225. At the back end thereof, the high band splitter 40 includes N-high band splitter/combiner ports. In the embodiment depicted in FIG. 1, the high band splitter 40 is configured to split the high band signal propagating from diplexer 22 into N-high band signals. The resultant N-high band signals are directed out of corresponding ones of the N-high band splitter/combiner ports as shown. In an alternate use of the present invention, N-way high-band splitter/combiner 40 can be configured to combine the N-high band signals directed into the N-high-band splitter/combiner ports to generate the high band signal. Those of ordinary skill in the art will understand that the signal power of each of the N-high band signals is nominally $1/N^{th}$ of the signal power of the high band signal propagating on transmission line 225. By nominally, one skilled in the art will understand that there is insertion loss in any RF component. Thus, the signal power of each of the N-high band signals will be less than $1/N^{th}$ of the signal power of the high band signal.

System 10 also includes an N-way low-band splitter/combiner 30 coupled to I/O diplexer port 223. The back-end of the splitter/combiner 30 includes N-low band splitter/combiner ports. The N-way low-band splitter/combiner is configured to split the low band signal propagating on line 223 into N-low band signals and direct the N-low band signals out of the N-low band splitter/combiner ports. Again, if the signal flow depicted in FIG. 1 is reversed, the N-low band signals would be directed into the N-low band splitter/combiner ports and the N-way low-band splitter/combiner 30 would combine these signals into the low band signal. The low band signal would be directed toward port 223 of diplexer 20 (via delay line 24 if the application so required). Again, those of ordinary skill in the art will understand that the signal power of each of the N-low band signals is nominally $1/N^{th}$ of the signal power of the low band signal propagating on transmission line 223. As explained previously, the signal power of each of the N-low band signals will be less than $1/N^{th}$ of the signal power of the low band signal because of insertion loss and/or other such losses.

The back-end 50 of the ultra wide-band power splitter system 10 includes N-output/input (O/I) diplexers (502-532) coupled to the N-way high-band splitter/combiner 40 and the N-way low-band splitter/combiner 30. Diplexer 502, for example, includes a low band signal input from power splitter 30 and a high band signal input from power splitter 40. The low band signal is combined with the high band signal to generate a wide band signal having substantially the same spectral characteristics as the RF incident signal directed into diplexer 22. Once again, the signal power of the output signal directed out of diplexer 502 will nominally be $1/N^{th}$ of the signal power of the RF incident signal directed into diplexer 22. Thus, each O/I diplexer of the N-O/I diplexers (502-532) includes a high band O/I diplexer port coupled to a corresponding high band port of the N-high band splitter/combiner 40 and a low band O/I diplexer port coupled to a corresponding low band port of the N-low band splitter/combiner 30. Each O/I diplexer includes a third O/I port disposed at the back-end side of the device. In the application depicted in FIG. 1, each O/I diplexer is configured to combine one of the N-high band signals and one of the N-low band signals to form a wide-band signal that is directed out of the third O/I diplexer port. Accordingly, N-ultra-wide band signals are directed out of the back end portion 50. If the signal flow were from right to left instead of from left to right (as depicted in FIG. 1), each O/I diplexer (502-532) would split a wide band signal directed into the back-end port into a high band signal and a low band signal. Each of the N wide band signals (e.g., shown as "output signals" in FIG. 1) are low power versions of the incident RF signal (e.g., shown as the "input signal" in FIG. 1). As noted above, the signal power of the output signals directed out of diplexers 502-532 will nominally be $1/N^{th}$ of the signal power of the RF incident signal directed into diplexer 22. The N wide band signals will have substantially the same spectral characteristics as the RF incident signal directed into diplexer 22.

Figure 2A:
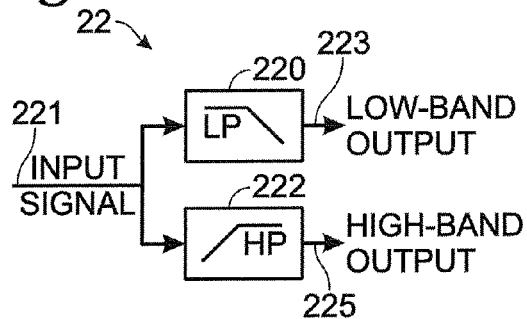
FIG. 2A is a diagrammatic depiction of an input diplexer for use in the ultra wide-band power splitter depicted in FIG. 1.
Figure 2B:
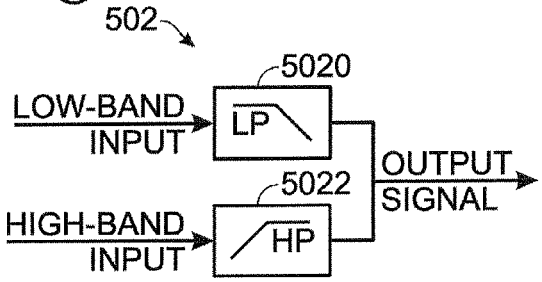
FIG. 2B is a diagrammatic depiction of an output diplexer for use in the ultra wide-band power splitter depicted in FIG. 1.

Referring to FIG. 2A, a diagrammatic depiction of input diplexer 22 for use in ultra wide-band power splitter 10 depicted in FIG. 1 is disclosed. In this embodiment, the diplexer 22 includes a low pass filter 200 disposed in parallel to high pass filter 222. The input port 221 is coupled to the input of filter 220 and filter 222. The filters (220, 222) are complementary having a crossover point for the responses of the two paths (i.e., high frequency path and low frequency path) at or near the 3 dB points. This approach may also be employed for the back end diplexers (502-532) as shown in FIG. 2B.

The low pass filter may be implemented using a series of lumped shunt capacitors separated by lumped series inductors. The high pass filter may be implemented using a series of lumped shunt inductors separated by lumped series capacitors. The number of lumped elements defines the order of the filter and the steepness of the filters response around the crossover frequency. There are various equivalent implementations of these filters where the lumped elements are printed within layers of a printed circuit board.

Figure 3A:
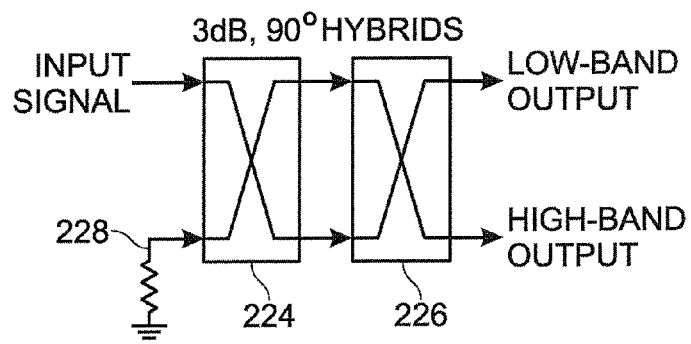
FIG. 3A is a diagrammatic depiction of an input diplexer for use in the ultra wide-band power splitter depicted in FIG. 1 in accordance with an alternate embodiment of the present invention.

Referring to FIG. 3A, a diagrammatic depiction of the front end diplexer 22 depicted in FIG. 1 in accordance with an alternate embodiment of the present invention is disclosed. In this embodiment, diplexer 22 includes a 3 dB, 90° hybrid coupler 224 disposed in tandem with 3 dB, 90° hybrid coupler 226 as shown. Each hybrid coupler includes two parallel transmission lines that are electromagnetically coupled to exhibit 3 dB coupling. Each of the four ports are matched at a design frequency at or near the high end of the band. At this design frequency the length of the coupled transmission lines equals one quarter wavelength.

A signal applied to the diplexer input port with a frequency equaling the design frequency at or near the upper end of the design band will split equally in the first hybrid coupler between the two output ports with a phase differential of 90°. These two signals will then recombine constructively (in-phase) in the second hybrid, to reconstruct the full signal on the high-band diplexer output port. Additionally the signals will combine destructively (180° out of phase) in the second hybrid so that no signal will exit the diplexer low-band output port. A signal applied to the diplexer input port at a frequency near the lower end of the design band will almost completely exit out the low-band diplexer output port since the electromagnetic coupling between the two lines in each hybrid coupler is very weak. The signal splitting and signal recombining in the two hybrid couplers occur at a frequency wherein the signal is split equally in the diplexer between the two output ports. This is the 3 dB crossover frequency.

Figure 3B:
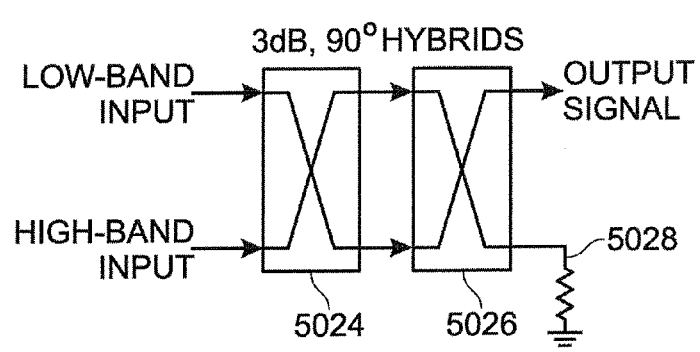
FIG. 3B is a diagrammatic depiction of an output diplexer for use in the ultra wide-band power splitter depicted in FIG. 1 in accordance with an alternate embodiment of the present invention.

For example, in one embodiment, the design frequency is 2700 MHz such that the diplexer circuit has a 3 dB crossover point at around 750 MHz. Due to the gradual roll-off of this type of diplexer, it is necessary for the low-band and high-band splitters to exhibit good performance beyond the crossover frequency. This approach depicted in FIG. 3A may also be used for the back-end diplexers. FIG. 3B is a detail view of one of the back-end diplexers (502-532) and employs the same arrangement described above with respect to FIG. 3A.

Figure 4A:
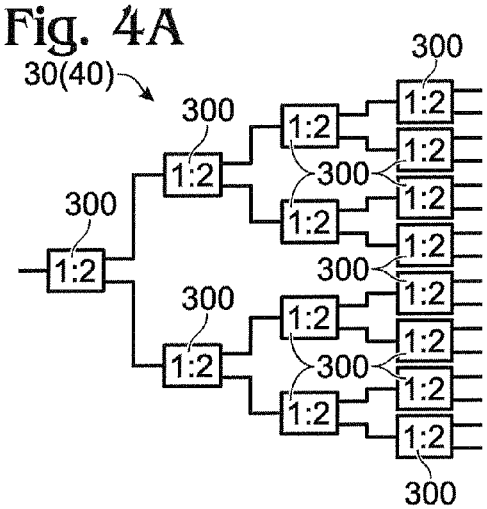
FIG. 4A is a schematic diagram illustrating a cascade of two-way splitter/combiners in the ultra wide-band power splitter depicted in FIG. 1 in accordance with one embodiment of the present invention.

Referring to FIG. 4A, a schematic diagram illustrating a multi-stage cascade of two-way splitter/combiners in accordance with an embodiment of the present invention is disclosed. FIG. 4A may be employed to implement either the high band power splitter 30 or the low band power splitter 40 depicted in FIG. 1. The sixteen port splitter/combiner architecture is implemented by cascading four stages, or layers, of 1×2 splitters/combiners. Using the high band channel as an example, the high band signal is directed into the 1×2 splitter/combiner at the left side of the diagram and is split into two high band signals having the same spectral characteristics, but approximately ½ the signal power. Each of these signals are directed into a second 1×2 splitter/combiner with the same result. In this case, N is a binary number, $2^P$ (2, 4, 8, 16, 32 . . . ), where the exponent P represents the number of stages in the splitter/combiner device. In the Example provided in FIG. 4A, there are four (4) stages and, therefore, N is equal to sixteen (16).

Figure 4B:
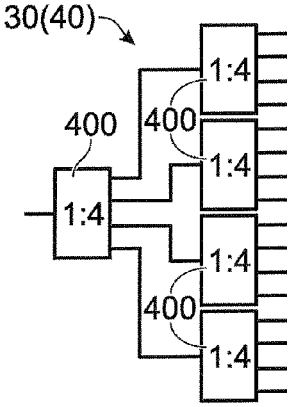
FIG. 4B is a schematic diagram illustrating a cascade of four-way splitter/combiners in the ultra wide-band power splitter depicted in FIG. 1 in accordance with one embodiment of the present invention.

Referring to FIG. 4B, a schematic diagram illustrating a cascade of four-way splitter/combiners in accordance with another embodiment of the present invention is disclosed. FIG. 4B may be employed to implement either the high band power splitter or the low band power splitter depicted in FIG. 1.

The present invention also contemplates using any combination of splitter/combiner "building blocks." For example 1×8 device may be implemented by employing a 1×4 device in the first stage and following with four (4) 1×2 devices. The order may also be reversed such that the first stage includes the 1×2 devices followed by two 1×4 devices. As noted above, the splitters can be implemented with a number of output ports that follows the binary form $2^n$ (2, 4, 8, 16, . . . ), where n is one or greater. A non-binary number of ports can be implemented by using the next larger binary dimension and terminating unused ports. The present invention also contemplates the use of non-binary sized building blocks. For example, a 6-way splitter may be implemented by cascading a 1×2 and two 1×3 splitter/combiners.

Figure 5:
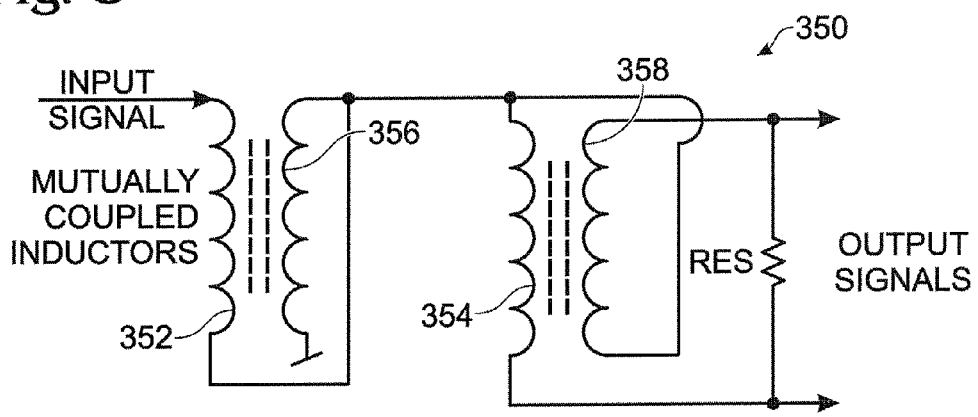
FIG. 5 is a schematic diagram of a two-way splitter/combiner in accordance with one embodiment of the present invention.

Referring to FIG. 5, a schematic diagram of a two-way splitter/combiner 350 in accordance with one embodiment of the present invention is disclosed. This device may be employed to implement a low band splitter/combiner. The splitter/combiner device 350 includes two pairs of mutually coupled inductors. The input pair includes inductor 352 and inductor 356. The output pair includes inductor 354 and inductor 358. Each inductor pair may be implemented using ferrite-core wire-wound mutually-coupled inductors as schematically depicted in FIG. 5. In the input stage, the impedance is transformed to one half (25 Ohms when operating in a 50 Ohms system) and the output stage divides the signal in two. The resistor (Res) is disposed across the output ports to ensure that the outputs signals are isolated and impedance matched. This device can be designed to operate over a bandwidth of at least 10 MHz to 1000 MHz. On the other hand, the performance of components of this type degrades rapidly above 1 GHz. The insertion loss and return loss are especially problematic.

Figure 6:
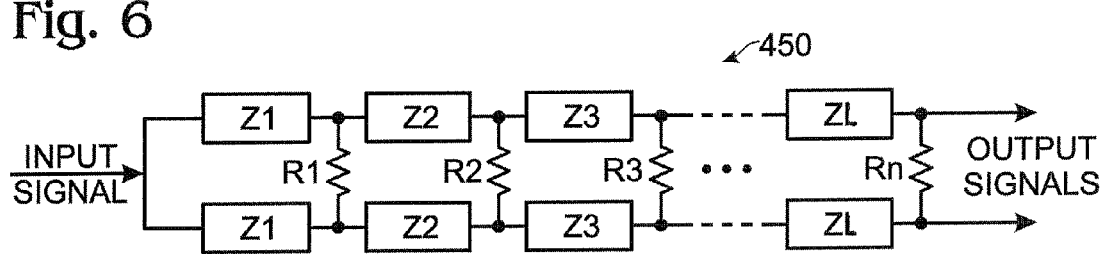
FIG. 6 is a schematic diagram of another two-way splitter/combiner in accordance with one embodiment of the present invention.

Referring to FIG. 6, a schematic diagram of a 1×2 splitter/combiner in accordance with another embodiment of the present invention is disclosed. In this embodiment, a Wilkinson type of two-way splitter/combiner is employed. The Wilkinson splitter combiner includes L stages, L being an integer value. Each stage of the Wilkinson consists of two transmission lines, that may or may not be electromagnetically coupled, with lengths at or near one quarter wavelength at the center of the design frequency band (1800 MHz in the example embodiment provided herein). The impedance is gradually changed in each stage from the highest value at the input to the lowest value at the outputs to thereby transform the impedance. A resistor is placed across the output of each section in order to insure that the outputs are impedance matched and isolated. The number of stages in the Wilkinson determines the component bandwidth and performance. Four or five stages are sufficient for the 600 MHz to 3000 MHz design band as mentioned above. Thus, the multi-section technique shown herein may be employed increase/decrease the bandwidth of the 1×2 component in accordance with the specifications of the application.

FIG. 7 is a chart illustrating the insertion loss performance of the diplexers depicted herein in accordance with an embodiment of the invention. Specifically, plot 700 shows the insertion loss performance of the diplexers (22, 502) depicted in FIGS. 3A-3B. The high band output 702 is about −20 dB at 10 MHz and reaches the 3 dB cross-over point at about 750 MHz. At the cross-over frequency, the low band output 704 is rolling off and is −20 dB at just under 2 GHz.

FIG. 8 is a chart illustrating the insertion loss performance of the N-way low-band splitter/combiner 30 and the N-way high-band splitter/combiner 40 depicted in FIG. 1. There are, of course, sixteen (16) paths for each splitter device. At the diplexer crossover frequency of 750 MHz the power will divide equally between the low-band and high band splitters.

Figure 9:
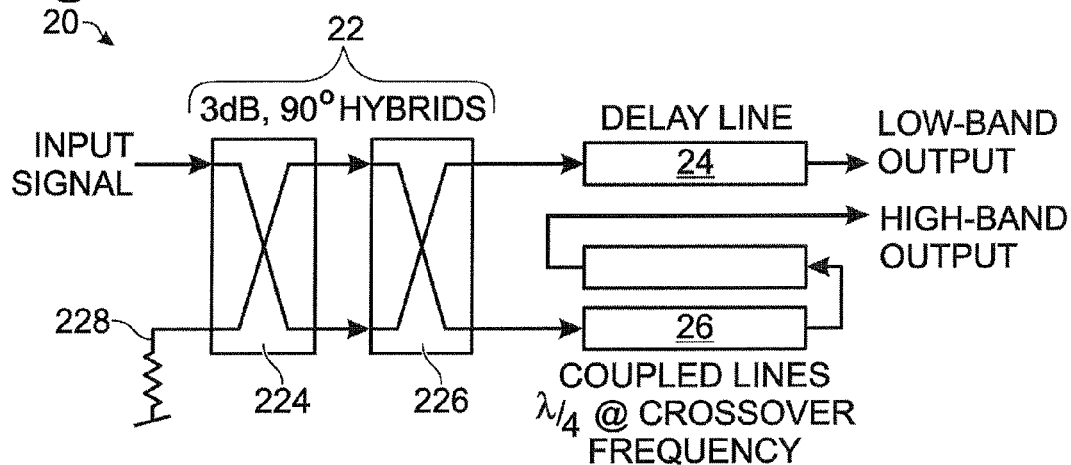
FIG. 9 is a detailed diagrammatic depiction of the input diplexer, delay line and phase correction network shown in FIG. 1.

As embodied herein, and depicted in FIG. 9, a detailed diagrammatic depiction of the front end portion 20 shown in FIG. 1 is disclosed. Front end portion 20 includes diplexer 22, delay line 24 and phase correction network 26. One of the difficulties associated with sandwiching the parallel N-way low-band splitter/combiner 30 and the N-way high-band splitter/combiner 40 between the front end diplexer 22 and the back end diplexers (502-532) relates to signal phase and delay issues. In particular, the delay network 24 and the phase correction 26 ensure that the signal combining occurs constructively, i.e., in-phase. The delay line 24 may be implemented as a section of transmission line with a predetermined length needed to compensate for the different delays through the low-band and high band splitters. The phase correction network 26 compensates for the 90° phase differential between the two paths through the diplexer 22. The phase correction may be implemented as a section of folded transmission line with a predetermined coupling, and a length that equals one quarter of a wavelength at the diplexer crossover frequency.

FIG. 10 is a chart illustrating the insertion loss performance for the ultra wide-band power splitter in accordance with an embodiment of the present invention. The output response 1002 is reasonably flat across the band with a loss of less than 2.1 dB beyond the nominal splitter loss of −12 dB. The nominal splitter loss of −12 dB refers to the fact that the signal power of each of the output signals is $1/N^{th}$ of the signal power of the incident RF signal because the RF signal has been divided N ways.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. A system comprising:
   a front-end interface device including a first front-end interface port, a second front-end interface port and a third front-end interface port, the front-end interface device being configured to split a first signal directed into the first front-end interface port into a second signal provided at the second front-end interface port and a third signal provided at the third front-end interface port, the first signal having a first bandwidth, the second signal having a second bandwidth and the third signal having a third bandwidth, the second bandwidth being substantially disposed in a relatively high frequency portion of the first bandwidth and the third bandwidth being substantially disposed in a relatively low frequency portion of the first bandwidth;
   an N-way high-band device including a first high-band device port coupled to the second front-end interface port and N second high band ports, N being an integer greater than or equal to two (2), the N-way high-band device being configured to split the second signal into N-high band signals and direct the N-high band signals out of corresponding ones of the N-second high band ports;

an N-way low-band device including a first low-band device port coupled to the third front-end interface port and N-second low band ports, the N-way low-band device being configured to split the third signal into N-low band signals and direct the N-low band signals out of corresponding ones of the N-second low band ports;

a delay element substantially disposed between the front-end interface and the N-way low-band device or the N-way high-band device;

a phase correction element disposed between the front-end interface and the N-way high-band device or the N-way low-band device; and N back-end interface devices coupled to the N-way high-band device and the N-way low-band device, each back-end interface device of the N back-end interface devices including a first back-end interface port coupled to a corresponding one of the N second high band ports, a second back-end interface port coupled to a corresponding one of the N second low band ports, and a third back-end interface port, each back-end interface being configured to combine one of the N-high band signals and one of the N-low band signals to form a fourth signal directed out of the third back-end interface port such that N-fourth signals are directed out of the N back-end interface devices, the fourth signal having a fourth bandwidth, the fourth signal being a version of the first signal such that the fourth bandwidth and the first bandwidth are substantially identical.

2. The system of claim 1, wherein the front-end interface device includes an input/output (I/O) diplexer.

3. The system of claim 2, wherein the I/O diplexer is also configured to combine the second signal and the third signal to form the first signal, the second signal being directed into the second front-end interface port, the third signal being directed into the third front-end interface port, and the first signal being directed out of the first front-end interface port.

4. The system of claim 2, wherein the I/O diplexer includes a first diplexer element coupled to a second diplexer element.

5. The system of claim 4, wherein the first diplexer element includes a low pass filter and the second diplexer element includes a high pass filter.

6. The system of claim 5, wherein the first front-end interface port is coupled to both the high pass filter and the low pass filter, the second front-end interface port is coupled to the high pass filter and the third front-end interface port is coupled to the low pass filter, whereby a response of the low pass filter overlaps a response of the high pass filter at a predetermined 3 dB cross-over frequency.

7. The system of claim 4, wherein the first diplexer element includes a first coupler device and the second diplexer element includes a second coupler device.

8. The system of claim 7, wherein the first coupler device includes a first 3 dB 90° hybrid coupler and the second coupler device includes a second 3 dB 90° hybrid coupler, the first 3 dB 90° hybrid coupler being coupled to the first front-end interface port, the second 3 dB 90° hybrid coupler being coupled to the first 3 dB 90° hybrid coupler, the second front-end interface port, and the third front-end interface port.

9. The system of claim 8, wherein each of the first 3 dB 90° hybrid coupler and the second 3 dB 90° hybrid coupler are comprised of coupled transmission lines having a length equal or substantially equal to a quarter wavelength corresponding to a predetermined design frequency.

10. The system of claim 9, wherein the predetermined design frequency results in the second bandwidth overlapping the third bandwidth at a predetermined 3 dB cross-over frequency.

11. The system of claim 1, wherein the N-way high-band device is configured as an N-way high-band splitter/combiner such that the N-high band signals are combined to form the second signal when the N-high band signals are directed into the N second high band ports, the second signal being directed out of the second front-end interface port.

12. The system of claim 11, wherein the N-way high-band device includes a plurality of splitter/combiner elements, at least one of the plurality of splitter/combiner elements being a 1×M splitter/combiner, M being an integer value greater than or equal to two.

13. The system of claim 12, wherein M is equal to a binary number $2^p$, p being an integer greater than or equal to one.

14. The system of claim 11, wherein the N-way high-band device is configured as a cascaded multi-stage device, each of the stages including at least one splitter/combiner.

15. The system of claim 11, wherein the N-way high-band device is configured to include Wilkinson splitter/combiner elements.

16. The system of claim 1, wherein the N-way low-band device is configured as an N-way low-band splitter/combiner such that the N-low band signals are combined to form the third signal when the N-low band signals are directed into the N second low band ports, the third signal being directed out of the third front-end interface port.

17. The system of claim 16, wherein the N-way low-band device includes a plurality of splitter/combiner elements, at least one of the plurality of splitter/combiner elements being a 1×M splitter combiner, M being an integer value greater than or equal to two.

18. The system of claim 17, wherein M is equal to a binary number $2^p$, p being an integer greater than or equal to one.

19. The system of claim 16, wherein the N-way low-band device is configured as a cascaded multi-stage device, each of the stages including at least one splitter/combiner.

20. The system of claim 16, wherein the N-way low-band device is configured to include lumped element splitter/combiner elements.

21. The system of claim 20, wherein each lumped element splitter/combiner element includes a pair of mutually coupled inductors.

22. The system of claim 21, wherein the mutually coupled inductors include ferrite-core wire-wound mutually coupled inductors.

23. The system of claim 1, wherein the N back-end interface devices include N-output/input (O/I) diplexers, each O/I diplexer being configured to split the fourth signal into a high band signal of the N-high band signals and a low band signal of the N-low band signals when the fourth signal is directed into the third back-end interface port, the high band signal being directed out of the first back-end interface port, and the low band signal being directed out of the second back-end interface port.

24. The system of claim 23, wherein each output/input (O/I) diplexer includes a first diplexer element coupled to a second diplexer element.

25. The system of claim 24, wherein the first diplexer element includes a low pass filter and the second diplexer element includes a high pass filter.

26. The system of claim 24, wherein the first diplexer element includes a first coupler device and the second diplexer element includes a second coupler device.

27. The system of claim 26, wherein the first coupler device includes a first 3 dB 90° hybrid coupler and the second coupler device includes a second 3 dB 90° hybrid coupler.

28. A system comprising:

a front-end interface device including a first front-end interface port, a second front-end interface port and a third front-end interface port, the front-end interface device being configured to combine a second signal directed into the second front-end interface port and a third signal directed into the third front-end interface port to form a first signal directed out of the first front-end interface port, the first signal having a first bandwidth, the second signal having a second bandwidth and the third signal having a third bandwidth, the second bandwidth being substantially disposed in a relatively high frequency portion of the first bandwidth and the third bandwidth being substantially disposed in a relatively low frequency portion of the first bandwidth;

an N-way high-band device including a first high-band device port coupled to the second front-end interface port and N second high band ports, N being an integer greater than or equal to two (2), the N-way high-band device being configured to combine N-high band signals directed into corresponding ones of the N-second high band ports to form the second signal;

an N-way low-band device including a first low-band device port coupled to the third front-end interface port and N-second low band ports, the N-way low-band device being configured to combine N-low band signals directed into corresponding ones of the N-second low band ports to form the third signal;

a delay element substantially disposed between the front-end interface and the N-way low-band device or the N-way high-band device;

a phase correction element disposed between the front-end interface and the N-way high-band device or the N-way low-band device; and N back-end interface devices coupled to the N-way high-band device and the N-way low-band device, each back-end interface device of the N back-end interface devices including a first back-end interface port coupled to a corresponding one of the N second high band ports, a second back-end interface port coupled to a corresponding one of the N second low band ports, and a third back-end interface port, each back-end interface device being configured to split a fourth signal directed into the third back-end interface port into one of the N-high band signals and one of the N-low band signals, each fourth signal having a fourth bandwidth, the fourth signal being a version of the first signal such that the fourth bandwidth and the first bandwidth are substantially identical.

29. The system of claim 28, wherein the first interface device includes an input/output (I/O) diplexer.

30. The system of claim 29, wherein the I/O diplexer is also configured to split the first signal into the second signal and the third signal, the second signal being directed out of the second front-end interface port, the third signal being directed out of the third front-end interface port, and the first signal being directed into of the first front-end interface port.

31. The system of claim 28, wherein the N-way high-band device is configured as an N-way high-band splitter/combiner such that the second signal may also be split to form the N-high band signals the second signal being directed into the second front-end interface port, the N-high band signals being directed out of the N second high band ports.

32. The system of claim 28, wherein the N-way low-band device is configured as an N-way low-band splitter/combiner such that the third signal may also be split to form the N-low band signals the third signal being directed into the third second front-end interface port, the N-low band signals being directed out of the N second low band ports.

33. The system of claim 28, wherein the N back-end interface devices include N-output/input (O/I) diplexers, each O/I diplexer being configured to combine a high band signal of the N-high band signals and a low band signal of the N-low band signals to form the fourth signal when the high band signal is directed into of the first back-end interface port and the low band signal is directed into the second back-end interface port, the fourth signal being directed out of the third back-end interface port.

34. A system comprising:

an input/output (I/O) diplexer including a first I/O diplexer port, a second I/O diplexer port and a third I/O diplexer port, the I/O diplexer being configured to split a first signal directed into the first I/O diplexer port into a second signal provided at the second I/O diplexer port and a third signal provided at the third I/O diplexer port, the I/O diplexer being configured to combine the second signal directed into the second I/O diplexer port and the third signal directed into the third I/O diplexer port to form the first signal provided at the first I/O diplexer port, the first signal having a first bandwidth, the second signal having a second bandwidth and the third signal having a third bandwidth, the second bandwidth being substantially disposed in a relatively high frequency portion of the first bandwidth and the third bandwidth being substantially disposed in a relatively low frequency portion of the first bandwidth;

an N-way high-band splitter/combiner coupled to the second I/O diplexer port and including N-high band splitter/combiner ports, the N-way high-band splitter/combiner being configured to split the second signal into N-high band signals and direct the N-high band signals out of corresponding ports of the N-high band splitter/combiner ports, the N-way high-band splitter/combiner also being configured to combine the N-high band signals directed into the N-high-band splitter/combiner ports into the second signal, N being an integer greater than or equal to two (2);

an N-way low-band splitter/combiner coupled to the third I/O diplexer port and including N-low band splitter/combiner ports, the N-way low-band splitter/combiner being configured to split the third signal into N-low band signals and direct the N-low band signals out of the N-low band splitter/combiner ports, the N-way low-band splitter/combiner also being configured to combine the N-low band signals directed into the N-low band splitter/combiner ports into the third signal;

N-output/input (O/I) diplexers coupled to the N-way high-band splitter/combiner and the N-way low-band splitter/combiner, each O/I diplexer of the N-O/I diplexers including a first O/I diplexer port coupled to a corresponding high band port of the N-high band splitter/combiner ports, a second O/I diplexer port coupled to a corresponding low band port of the N-low band splitter/combiner ports, and a third O/I port, each O/I diplexer being configured to combine one of the N-high band signals and one of the N-low band signals to form a fourth signal directed out of the third O/I diplexer port such that N-fourth signals are directed out of the N-O/I diplexers, each O/I diplexer also being configured to split the fourth signal into one of the N-high band signals and one of the N-low band signals such that the fourth signal is directed into the third O/I port, the high band signal being directed out of the first O/I port and the low band signal being directed out of the second O/I port, the fourth signal having a fourth bandwidth, the fourth signal being a version of the first signal such that the fourth bandwidth and the first bandwidth are substantially identical and;

a delay element substantially disposed between the third I/O diplexer port and the N-way low-band device or between the second I/O diplexer port and the N-way high-band device; and a phase correction element disposed between the second I/O diplexer port and the N-way high-band device or between the third I/O diplexer port and the N-way low-band device.

* * * * *